United States Patent [19]
Sakai

[11] Patent Number: 5,855,725
[45] Date of Patent: Jan. 5, 1999

[54] VACUUM PROCESSING SYSTEM AND METHOD OF REMOVING FILM DEPOSITED ON INNER FACE OF VACUUM VESSEL IN THE VACUUM PROCESSING SYSTEM

[75] Inventor: Jonro Sakai, Tokyo, Japan

[73] Assignee: Anelva Corporation, Tokyo, Japan

[21] Appl. No.: 655,144

[22] Filed: May 30, 1996

[30] Foreign Application Priority Data

May 30, 1995 [JP] Japan .................................. 7-156971

[51] Int. Cl.$^6$ .................................................. H05H 11/00
[52] U.S. Cl. ............................ 156/345; 118/723 ER; 118/723 IR
[58] Field of Search ..................... 156/345; 204/298.37; 118/723 I, 723 IR, 723 E, 723 MR, 723 MA

[56] References Cited

U.S. PATENT DOCUMENTS 5,444,207  8/1995  Sekine et al. ..................... 156/345 X Primary Examiner—Thi Dang
Attorney, Agent, or Firm—Sughrue, Mion, Zinn, Macpeak & Seas, PLLC

[57] ABSTRACT

A vacuum processing system for executing processing with plasma. The system includes plasma arrival prevention magnets for forming a magnetic field along the inner face of a vacuum vessel to prevent plasma from arriving at the inner face of the vacuum vessel, and a move mechanism for relatively moving the plasma arrival prevention magnets or the vacuum vessel so as to compensate vector unevenness of the plasma arrival prevention magnets in a direction of the inner face of the vacuum vessel for uniformly depositing a thin film on the inner face. The move mechanism moves the plasma arrival prevention magnets or the vacuum vessel during the vacuum processing interim and at the etching removal of the thin film deposited on the inner face of the vacuum vessel.

21 Claims, 5 Drawing Sheets

POSITION ON INNER FACE OF VACUUM VESSEL

VACUUM PROCESSING SYSTEM AND METHOD OF REMOVING FILM DEPOSITED ON INNER FACE OF VACUUM VESSEL IN THE VACUUM PROCESSING SYSTEM

BACKGROUND OF THE INVENTION

1. Field of the Invention

This invention relates to a vacuum processing system for performing substrate processing with plasma and in particular to a vacuum processing system having a structure for preventing plasma from arriving at the inner face of a vacuum vessel.

2. Description of the Related Art

Various vacuum processing systems for performing substrate processing with plasma are available. Hitherto, plasma etching and plasma CVD (chemical vapor deposition) systems have been known as equipments for manufacturing semiconductor devices, liquid crystal displays and the like.

FIG. 5 is a schematic view showing one example of such a conventional vacuum processing system. The vacuum processing system shown in FIG. 5 consists mainly of a vacuum vessel 1 provided with an exhaust channel 11, a gas introduction mechanism 2 for introducing a predetermined gas into the vacuum vessel 1, a power supply mechanism 3 for energizing the introduced gas for generating plasma, and a substrate holder 4 for placing a substrate 40 as an object in a position where the substrate is to be subjected to plasma processing.

The system in FIG. 5 carries a substrate 40 into the vacuum vessel 1 through a gate valve (not shown) and places the substrate 40 on the substrate holder 4. After evacuating air in the vacuum vessel 1 through the exhaust channel 11, the system introduces a predetermined gas by the gas introduction mechanism 2. Next, the system applies energy of high-frequency power and the like to the gas in the vacuum vessel 1 by the power supply mechanism 3 for generating plasma. Then, the system executes predetermined processing on the substrate 40 with activated species generated in the plasma.

When the plasma diffuses and arrives at the inner face of the vacuum vessel 1 in the vacuum processing system, it dissipates in that portion. Then, hitherto, a structure for setting a magnetic field along the inner face of the vacuum vessel 1 for preventing plasma from arriving at the inner face has been adopted.

FIG. 6 is a schematic sectional plan view for explaining the configuration of plasma arrival prevention magnets adopted for the above purpose. As seen in FIGS. 5 and 6, the plasma arrival prevention magnets 5 are plate-shaped permanent magnets placed so as to be in contact with the outer face of the vacuum vessel 1 and extend to the top and bottom. The magnets 5 are placed so that magnetic poles on the inner surface of the vacuum vessel 1 differ alternately, forming cusp magnetic field as shown in FIG. 6 along the inner face of the vacuum vessel 1.

Since charged particles in plasma are hard to move in a direction crossing a magnetic line of force, if plasma generated at the center of the vacuum vessel 1 diffuses to the peripheries, it is prevented from arriving at the inner face of the vacuum vessel 1. Thus, the plasma loss on the inner face of the vacuum vessel 1 can be prevented, maintaining the plasma in the vacuum vessel 1 at a high density for enhancing the processing efficiency for the object.

As processing continues in the conventional vacuum processing system, often a thin film is deposited on the inner face of the vacuum vessel. The thin film deposition on the inner face of the vessel is frequently observed in a thin film deposition system for executing thin film deposition processing such as CVD and an etching system for etching a thin film on a substrate.

When such a thin film deposited on the inner face of the vessel becomes thick, it peels off and becomes dust drifting in the vacuum vessel. If the dust adheres to the object, the quality of the vacuum processing may be seriously impaired. For example, if processing for manufacturing an integrated circuit is executed, a fatal circuit failure may be caused by dust adhering to the integrated circuit.

Since the conventional vacuum processing system of the type described above has the plasma arrival prevention magnets for preventing plasma from arriving at the inner face of the vessel, a thin film is comparatively less deposited on the inner face of the vessel. However, since the magnetic field distribution set by the plasma arrival prevention magnets is uneven, the thickness of the deposited thin film also becomes uneven. Resultantly, the following problems sometimes occur:

FIGS. 7 (*a*) to 7 (*c*) are illustrations of uneven thin film deposition on the inner face of the vessel. Here, for the description, the inner face of the vacuum vessel shown in FIG. 5 is converted into a plan. In FIGS. 7 (*a*) to 7 (*c*), the vertical axis denotes the film thickness or plasma density and the horizontal axis denotes the position on the inner face of the vacuum vessel.

As shown in FIGS. 6 and 7 (*a*), magnetic lines of force 51 shaped like a small arc different in direction alternately are arranged along the inner face of the vacuum vessel by the plasma arrival prevention magnets 5. On the other hand, as described above, the plasma arrival prevention magnets 5 use the fact that plasma is hard to diffuse crossing the magnetic lines of force 51.

In this case, since the belly part of the arc-shaped magnetic line of force 51 is almost vertical with respect to a diffusion direction 52 of plasma to the inner face of the vacuum vessel 1, a sufficient plasma arrival prevention effect is produced. However, the direction of the magnetic line of force 51 crosses the plasma diffusion direction 52 at a small angle in the vicinity of the joint part of the arc, namely, the incoming or outgoing radiation point of the magnetic line of force 51 to the inner face of the vessel. Therefore, the plasma arrival prevention effect is weakened. This means that unevenness of the magnetic field vector causes the plasma arrival prevention effect to become uneven. Resultantly, the plasma loss on the inner face of the vessel in the vicinity of the incoming or outgoing radiation point of the magnetic line of force 51 increases and the plasma density in a direction along the inner face of the vessel (at positions equally distant from the inner face of the vessel) has an uneven distribution in which it is low in the belly part of the arc-shaped magnetic line of force and high in the joint part, as shown in FIG. 7 (*b*).

In the joint part of the arc-shaped magnetic line of force 51 where the plasma arrival prevention effect is small, the inner face of the vessel is briskly irradiated with charged particles. As an ion assist method of applying a bias voltage to a substrate and irradiating the substrate with ions for accelerating thin film deposition is available in a thin film deposition process, thin film deposition on the inner face of the vessel is accelerated upon irradiation with the charged particles, and a thick film is deposited in a short time as compared with the belly part of the magnetic line of force 51. Resultantly, the film thickness distribution on the inner face of the vessel after execution of vacuum processing for a considerable time becomes a distribution where the film is extremely thick in the joint parts of the magnetic lines of force 51 and is thin (almost zero) in the belly parts, as shown in FIG. 7 (c). The thickly deposited film in the joint parts easily peels off and causes harmful dust to occur as described above.

On the other hand, a plasma etching method is applied to removal of a deposited thin film. That is, for example, a fluorine-based gas such as carbon tetrafluoride and an oxygen gas are introduced into the vacuum vessel 1 by the gas introduction mechanism 2 and plasma is generated by the power supply mechanism 3. Fluorine-based activated species are formed in the plasma and the thin film is etched and removed by the brisk chemical action of the fluorine-based activated species.

In this case, since the etching progress depends on the activated seed generation amount, the etch rate distribution in the direction of the inner face of the vessel corresponds to the above-mentioned plasma density distribution. That is, many activated species are supplied to the belly parts of the magnetic lines of force 51 and etching well proceeds, but fewer activated species are supplied to the joint parts and etching does not sufficiently proceed. Thus, the etch rate becomes low in the joint parts requiring highly efficient etching and even if etching is executed for a predetermined time, a thin film is left in the joint parts. If an attempt is made to completely remove the thin film, the etching must be executed for a very long time, during which vacuum processing needs to be stopped, remarkably lowering the productivity.

SUMMARY OF THE INVENTION

It is therefore an object of the invention to uniformly deposit a thin film on the inner face of a vacuum vessel for suppressing dust caused by the thin film which peels off and when the thin film is etched and removed, to complete removal of the thin film in a short time without any remaining thin film.

In attaining the above object, one aspect of the invention provides a vacuum processing system for generating plasma in a vacuum vessel and processing an object with the generated plasma, the vacuum processing system comprising: plasma arrival prevention magnet means for forming a magnetic field along an inner face of the vacuum vessel to prevent the plasma from arriving at the inner face of the vacuum vessel; and move means for moving the plasma arrival prevention magnet means relatively to the vacuum vessel so as to compensate vector unevenness of the plasma arrival prevention magnet means in a direction of the inner face of the vacuum vessel for uniformly depositing a thin film on the inner face.

Another aspect of the invention provides a vacuum processing system for generating plasma in a vacuum vessel and treating an object with the generated plasma, the vacuum processing system comprising: plasma arrival prevention magnet means for forming a magnetic field along an inner face of the vacuum vessel to prevent the plasma from arriving at the inner face of the vacuum vessel; and move means for moving the vacuum vessel relatively to the plasma arrival prevention magnet means so as to compensate vector unevenness of the plasma arrival prevention magnet means in a direction of the inner face of the vacuum vessel for uniformly depositing a thin film on the inner face.

Another aspect of the invention provides, in a vacuum processing system for generating plasma in a vacuum vessel and treating an object with the generated plasma, the vacuum processing system comprising: plasma arrival prevention magnet means for forming a magnetic field along an inner face of the vacuum vessel to prevent the plasma from arriving at the inner face of the vacuum vessel; and move means for moving the plasma arrival prevention magnet means relatively to the vacuum vessel so as to compensate vector unevenness of the plasma arrival prevention magnet means in a direction of the inner face of the vacuum vessel for uniformly depositing a thin film on the inner face, a method of removing the thin film deposited on the inner face of the vacuum vessel comprising the steps of: treating the object; and etching and removing the thin film deposited on the inner face of the vacuum vessel, wherein the plasma arrival prevention magnet means is moved so as to compensate vector unevenness of the plasma arrival prevention magnet means in the inner face direction of the vacuum vessel for uniform etching on the inner face.

Another aspect of the invention provides, in a vacuum processing system for generating plasma in a vacuum vessel and treating an object with the generated plasma, the vacuum processing system comprising: plasma arrival prevention magnet means for forming a magnetic field along an inner face of the vacuum vessel to prevent the plasma from arriving at the inner face of the vacuum vessel; and move means for moving the plasma arrival prevention magnet means relatively to the vacuum vessel so as to compensate vector unevenness of the plasma arrival prevention magnet means in a direction of the inner face of the vacuum vessel for uniformly depositing a thin film on the inner face, a method of removing the thin film deposited on the inner face of the vacuum vessel comprising the steps of: treating the object; and etching and removing the thin film deposited on the inner face of the vacuum vessel, wherein the vacuum vessel is moved so as to compensate vector unevenness of the plasma arrival prevention magnet means in the inner face direction of the vacuum vessel for uniform etch on the inner face.

DETAILED DESCRIPTION OF THE PREFERRED EMBODIMENTS

Referring now to the accompanying drawings, there are shown preferred embodiments of the invention.

First Embodiment

Figure 1:
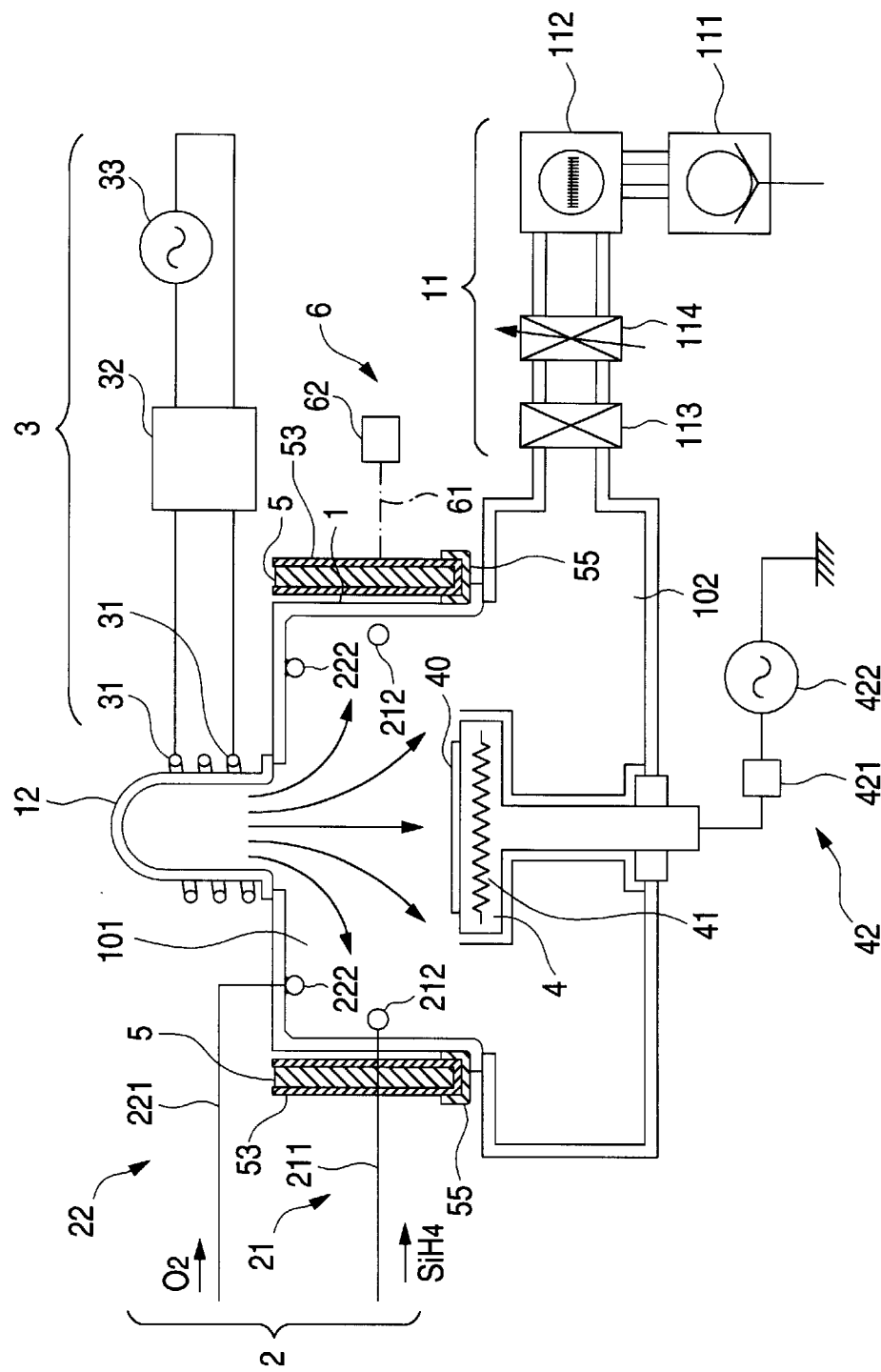
FIG. 1 is a schematic view showing a vacuum processing system according to a first embodiment of the invention.

FIG. 1 is a schematic view showing a vacuum processing system according to a first embodiment of the invention. The vacuum processing system shown in FIG. 1 comprises a vacuum vessel 1 provided with an exhaust channel 11, a gas introduction mechanism 2 for introducing a predetermined gas into the vacuum vessel 1, a power supply mechanism 3 for energizing the introduced gas for generating plasma, and a substrate holder 4 for placing a substrate 40 as an object in a position where the substrate is to be subjected to plasma processing. The system further comprises plasma arrival prevention magnets 5 for preventing plasma from arriving at the inner face of the vacuum vessel 1 and a move mechanism 6 for relatively moving the plasma arrival prevention magnets 5 or the vacuum vessel 1.

The vacuum vessel 1 comprises a film depositing chamber 101 and an air evacuating chamber 102 having a little large space positioned below the film depositing chamber 101. The container wall of the vacuum vessel 1 in the part of the film depositing chamber 101 is provided with a gate valve (not shown) and the container wall in the part of the air evacuating chamber 102 is provided with an exhaust pipe 13 to which the exhaust channel 11 is connected. The exhaust channel 11 consists mainly of a roughing vacuum pump 111, a main pump 112 placed at the stage preceding the roughing vacuum pump 111, and a main valve 113 and a variable conductance valve 114 placed on an exhaust path for exhausting by the pumps 111 and 112.

The film depositing chamber 101 and the air evacuating chamber 102 may be formed by one vacuum vessel 1, but may be formed by two vacuum vessels 1 connected in airtight relation for allowing the two vacuum vessels 1 to be separated at the time of maintenance or the like.

The vacuum vessel 1 has a bell jar 12 on the top thereof. A circular opening is made at the center of the upper container wall of the vacuum vessel 1 and the bell jar 12 is connected to the opening in airtight relation. The bell jar 12 has a cylindrical shape of about 100 mm in diameter with a dome shape at the top end and an opening made in the bottom end, and is made of a dielectric material such as silica glass.

In the example shown in FIG. 1, the gas introduction mechanism 2 comprises two gas introduction channels 21 and 22 so that it can introduce two different gases at the same time. The gas introduction channel 21 (22) consists mainly of piping 211 (221) connected to a tank (not shown) and a gas introduction body 212 (222) connected to the end portion of the piping 211 (221).

Figure 2:
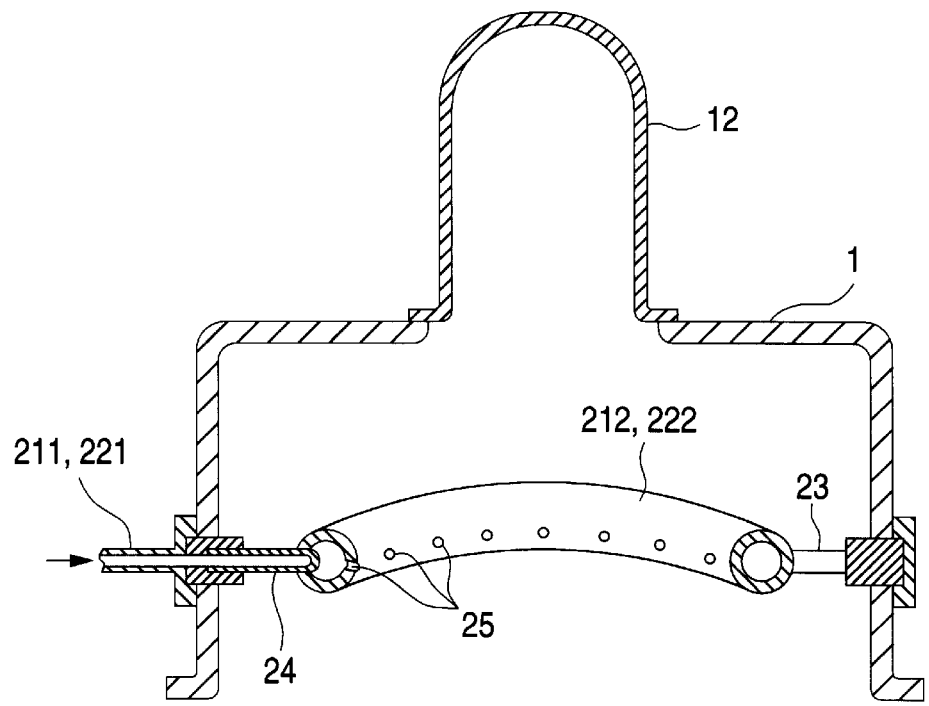
FIG. 2 is a view showing the structure of a gas introduction body in FIG. 1.

FIG. 2 is a view showing the structure of the gas introduction body. As shown in FIG. 2, the gas introduction body 212, 222 is made of an annular pipe having a circular cross section. It is supported by a support rod 23 disposed in the vacuum vessel 1 and is placed horizontally along the inner face of the vacuum vessel 1. The vacuum vessel 1 is cylindrical.

Further, a transport pipe 24 is provided in a state in which it passes through the wall of the vacuum vessel 1 in airtight relation; it is connected at one end to the gas introduction body 212, 222 and at the other end to the piping 211, 221 in FIGS. 1 and 2.

As shown in FIG. 2, the gas introduction body 212, 222 has gas spouting holes 25 on the inner side face. The gas spouting holes 25 are openings each having about 0.5 mm in diameter and disposed on the peripheral surface at intervals of about 25 mm.

On the other hand, referring again to FIG. 1, the power supply mechanism 3 consists mainly of a high-frequency coil 31 placed surrounding the bell jar 12, and a high-frequency power supply 33 for supplying high-frequency power via a matching box 32 to the high-frequency coils 31. For example, a device for generating high-frequency power of 13.56 MHz is adopted as the high-frequency power supply 33; the high-frequency power is supplied from the high-frequency coil 31 to the bell jar 12.

The substrate holder 4 is disposed below the bell jar 12 in the vacuum vessel 1. The holder 4 is provided to place a substrate 40 to be treated on the top face thereof, and contains a temperature adjustment mechanism 41 for heating or cooling the substrate 40 as required. A substrate bias voltage application mechanism 42 is provided for applying a predetermined bias voltage to the substrate 40 by the interaction between generated plasma and high frequency. The mechanism 42 is comprised of a matching box 421 and a high-frequency power supply 422 for supplying predetermined high-frequency power to the substrate holder 4 via the matching box 421. The high-frequency power supplied to the substrate holder 4 applies a predetermined bias voltage to the substrate 40 by the interaction with the plasma, contributing to efficient processing by ion bombardment and the like.

Figure 3:
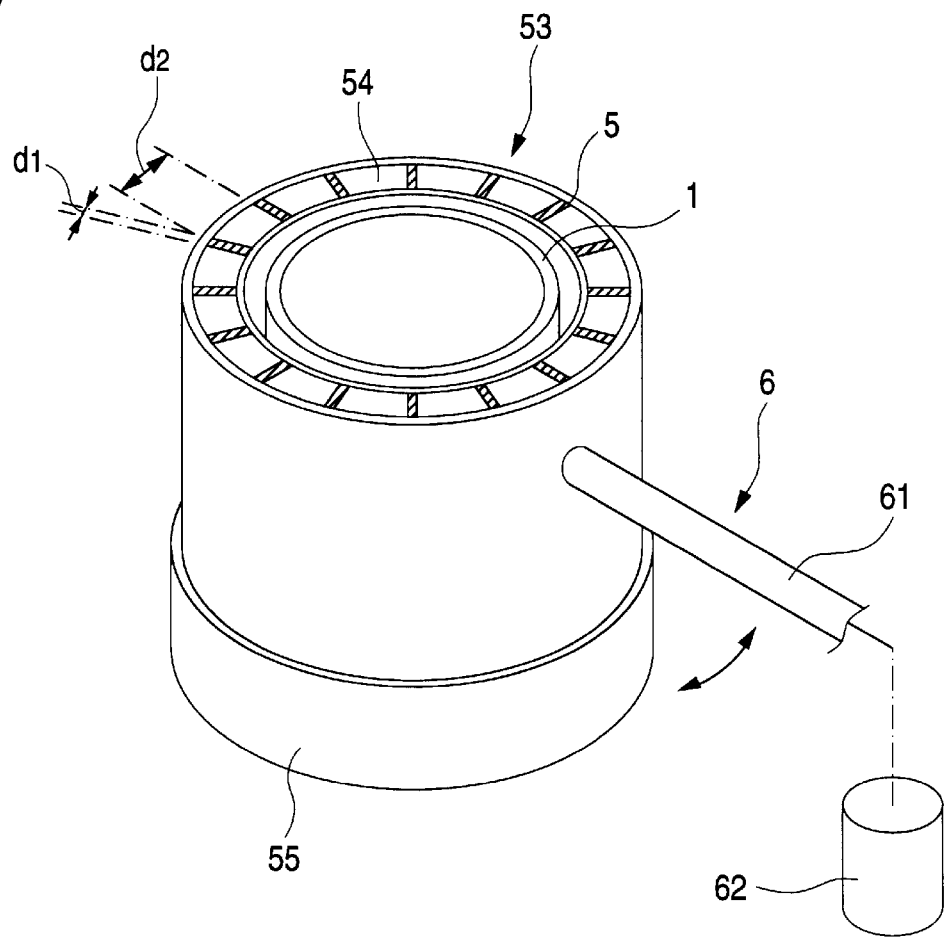
FIG. 3 is a schematic perspective view showing the configuration of plasma arrival prevention magnets and a move mechanism in the system in FIG. 1.

Next, the configuration of the plasma arrival prevention magnets 5 and the move mechanism 6, which is a large feature of the system of the embodiment, will be discussed. FIG. 3 is a schematic perspective view showing the configuration of the plasma arrival prevention magnets 5 and the move mechanism 6 in the system in FIG. 1.

Figure 6:
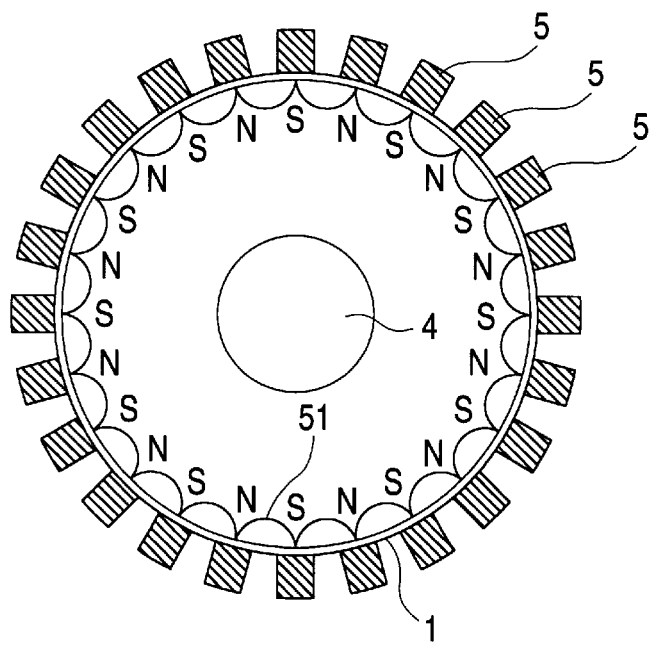
FIG. 6 is a schematic sectional plan view for explaining the configuration of plasma arrival prevention magnets adopted for the system in FIG. 5.

As shown in FIGS. 1 and 3, the plasma arrival prevention magnets 5 are plate-shaped permanent magnets placed so as to extend to the top and bottom along the outer face of the vacuum vessel 1 as in FIG. 6. The magnets 5 are equally spaced from each other circumferentially along the outer face of the vacuum vessel 1. Further, the magnets 5 are held by a magnet holder 53.

The magnet holder 53 has a double pipe structure comprising inner and outer cylindrical members coupled at the bottom ends by an annular bottom plate portion. The holder 53 contains partitions 54 for partitioning the inside according to the width and spacing of the plasma arrival prevention magnets 5, each of which is embedded between the partitions 54. The width d1 of each plasma arrival prevention magnet 5 is about 8 mm and the spacing d2 is about 52 mm. The magnet holder 53 is placed in a position slightly apart from the outer face of the vacuum vessel; they are not in contact with each other.

On the other hand, the move mechanism 6 of the embodiment is adapted to move (in the embodiment, rotate) the plasma arrival prevention magnets 5 rather than the vacuum vessel 1.

The magnet holder 53 is supported rotatably by a rotation guide body 55, which is an annular member formed with a circumferential groove. The magnet holder 53 is fitted at the bottom end thereof into the circumferential groove so that it is supported by the rotation guide body 55, which has bearings (not shown) in the contact parts with the magnet holder 53.

The move mechanism 6 consists mainly of a crank 61 coupled to the magnetic holder 53 and a drive source 62 for driving the crank 61 to rotate the magnet holder 53 at a predetermined angle.

When the drive source 62 shown in FIG. 3 is driven, the magnet holder 53 is rotated at a predetermined angle on the center axis of the magnet holder 53 via the crank 61, whereby the plasma arrival prevention magnets 5 are rotated together. The allowable rotation angle may be the sum of the width d1 of the plasma arrival prevention magnet 5 and the spacing d2, that is, (d1+d2).

Next, the operation of the vacuum processing system will be discussed.

First, the substrate 40 is transferred into the vacuum vessel 1 through the gate valve (not shown) disposed in the vacuum vessel 1 and is placed on the substrate holder 4 as shown in FIG. 1. The gate valve is closed and the exhaust channel 11 is operated for evacuating the vacuum vessel 1 to about 5 mTorr, for example.

Next, the gas introduction mechanism 2 is operated for introducing predetermined gases into the vacuum vessel 1 at a predetermined flow rate. At this time, the gases are supplied from the pipings 211 and 221 via the transport pipes 24 to the gas introduction bodies 212 and 222, and are spouted out and introduced into the vacuum vessel 1 through the gas spouting holes 25 of the gas introduction bodies 212 and 222. The introduced gases diffuse in the vacuum vessel 1 and reach the inside of the bell jar 12.

In this state, the power supply mechanism 3 is operated for applying high-frequency power from the high-frequency power supply 33 via the matching box 32 to the high-frequency coil 31. This high-frequency power is supplied to the inside of the bell jar 12 through the high-frequency coil 31 and energizes the gases existing in the bell jar 12 for producing plasma. The produced plasma diffuses downward from the bell jar 12 to the substrate 40. In the plasma, a predetermined product is produced, which then arrives at the substrate 40, whereby predetermined processing is executed.

For example, to deposit a silicon oxide thin film by the plasma CVD method, a mono-silane gas is introduced through the first gas introduction channel 21 and an oxygen gas is introduced through the second gas introduction channel 22. Mono-silane is decomposed by mono-silane/oxygen plasma and reacts with oxygen to deposit a silicon oxide thin film.

When the vacuum processing is thus executed for a predetermined time, the operation of the gas introduction mechanism 2 and the power supply mechanism 3 is stopped and the processing is terminated. Again the exhaust channel 11 is operated for removing the internal remaining gas, then the gate valve is opened and the substrate 40 is carried out of the vacuum vessel 1.

After this, likewise, another substrate 40 is transferred in the vacuum vessel 1 and the vacuum processing is repeated. In the operation of the system of the embodiment, the move mechanism 6 is operated between one processing and another. That is, the drive source 62 is operated for rotating the plasma arrival prevention magnets 5 together at a predetermined angle, then another substrate 40 is carried in the vacuum vessel 1 and the processing is repeated.

As the vacuum processing has been repeated a predetermined number of times, it is decided that the thin film deposition on the inner face of the vacuum vessel 1 reaches one thickness, and the thin film is removed by plasma etching. That is, for example, a fluorine-based gas such as carbon tetrafluoride and a hydrogen gas are introduced into the vacuum vessel 1 by the gas introduction mechanism 2 and plasma of these gases is generated by operating the power supply mechanism 3. Fluorine-based excited activated species are provided in the plasma and arrive at the inner face of the vacuum vessel 1 for etching the thin film. During the etching, the exhaust channel 11 evacuates the vacuum vessel 1 and the etched material is discharged through the exhaust channel 11.

In the operation of the vacuum processing system of the embodiment, the move distance of the plasma arrival prevention magnets 5 when the move mechanism 6 is once driven is set in relation to the allowable number of processing times of the vacuum processing system. This point will be discussed in more detail with reference to FIG. 3.

Letting the distance of moving the plasma arrival prevention magnets 5 when the move mechanism 6 of the embodiment is once driven be $\Delta d$, the distance between the joint parts of the arc magnetic line of force set by the plasma arrival prevention magnets 5 be D, and the allowable number of processing times be N, $\Delta d = D/N$.

The distance D between the joint parts of the arc magnetic line of force corresponds to the distance between the center points of the fronts of the contiguous plasma arrival prevention magnets 5 (facing the inside of the vacuum vessel 1) and therefore equals the sum of the width d1 of the plasma arrival prevention magnet 5 and the spacing d2 shown in FIG. 3, that is, (d1+d2).

On the other hand, the allowable number of processing times means the number of times vacuum processing can be executed before a thin film deposited on the inner face of the vessel peels off. For example, when the vacuum processing has been repeated 100 times, the thin film deposition on the inner face of the vacuum vessel 1 reaches a fair thickness and if the vacuum processing is repeated more several times, it is feared that the thin film may peel off, in which plasma etching is executed for removing the thin film as described above before new vacuum processing is started. In this case, the allowable number of processing times is 100.

With more specific numeric values, to deposit a silicon oxide thin film described above by plasma enhanced CVD, a vacuum vessel 1 of about 360 mm in diameter is used. In this case, the width dl of the plasma arrival prevention magnet 5 is set to 8 mm and the spacing d2 is set to 52 mm, for example. Therefore, the distance D becomes 60 mm. On the other hand, assuming that the allowable number N of processing times is 100, one move distance $\Delta d$ becomes 0.6 mm; it becomes about 0.1 degrees in terms of rotation angle.

Upon completion of the hundredth move after the vacuum processing has been repeated, a move has been made by the width d1 of the plasma arrival prevention magnet 5 plus the spacing d2. Therefore, placement of the magnetic lines of force becomes the same as the state in which the first processing is executed. That is, the arc-shaped magnetic lines of force shown in FIG. 6 shift little by little each time the move mechanism 6 is driven, and a move made after the termination of the hundredth processing causes them to just overlap the contiguous arc-shaped magnetic lines of force placed at the first processing time.

Figure 7:
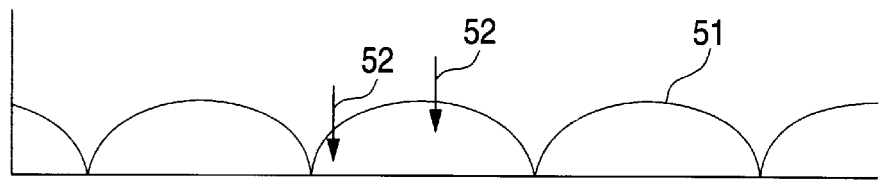
FIGS. 7 (a) to 7 (c) are illustrations of uneven thin film deposition on the inner face of a vessel.
Figure 7:
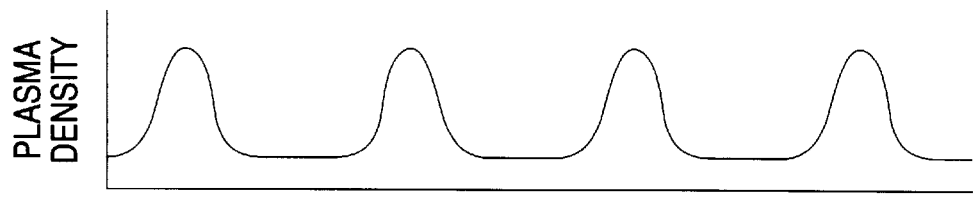
Figure 7:

If the arc-shaped magnetic lines of force are thus made to move little by little, although the thin film deposition on the inner face of the vessel at one vacuum processing is uneven as described above, the film thickness is made even in the process of repeating the processing up to the allowable number of processing times. This means that the thin film locally thick in the conventional system as shown in FIG. 7 (c) is distributed throughout the full inner face of the vacuum vessel 1.

Figure 5:
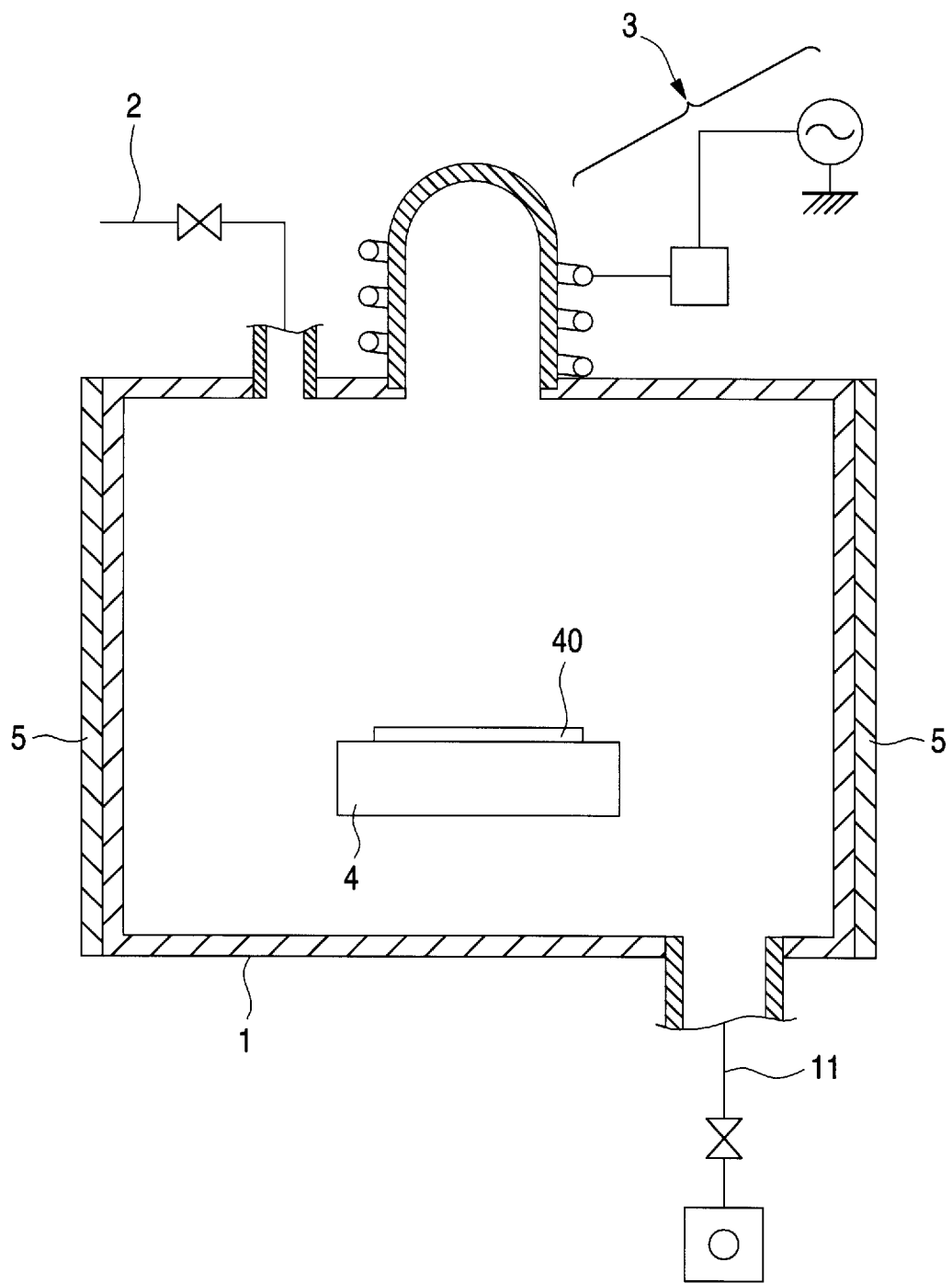
FIG. 5 is a schematic view showing one example of a conventional vacuum processing system.

Thus, the number of processing times allowable until the film thickness limit on which the thin film will peel off is reached can be set to a markedly large value as compared with the conventional system. Although the maximum number of processing times is about 50 in the conventional system shown in FIG. 5, it may reach about 1000 in the system of the embodiment.

In the embodiment, for another 100 repetitions of processing after 100 processing repetitions, the magnet holder 53 may be rotated at a predetermined angle at a time in the opposite direction or may be returned to the initial position, then rotated in the same direction. If the mechanism can be rotated 360 degrees, the magnet holder 53 may always be rotated in the same direction.

Second Embodiment

Figure 4:
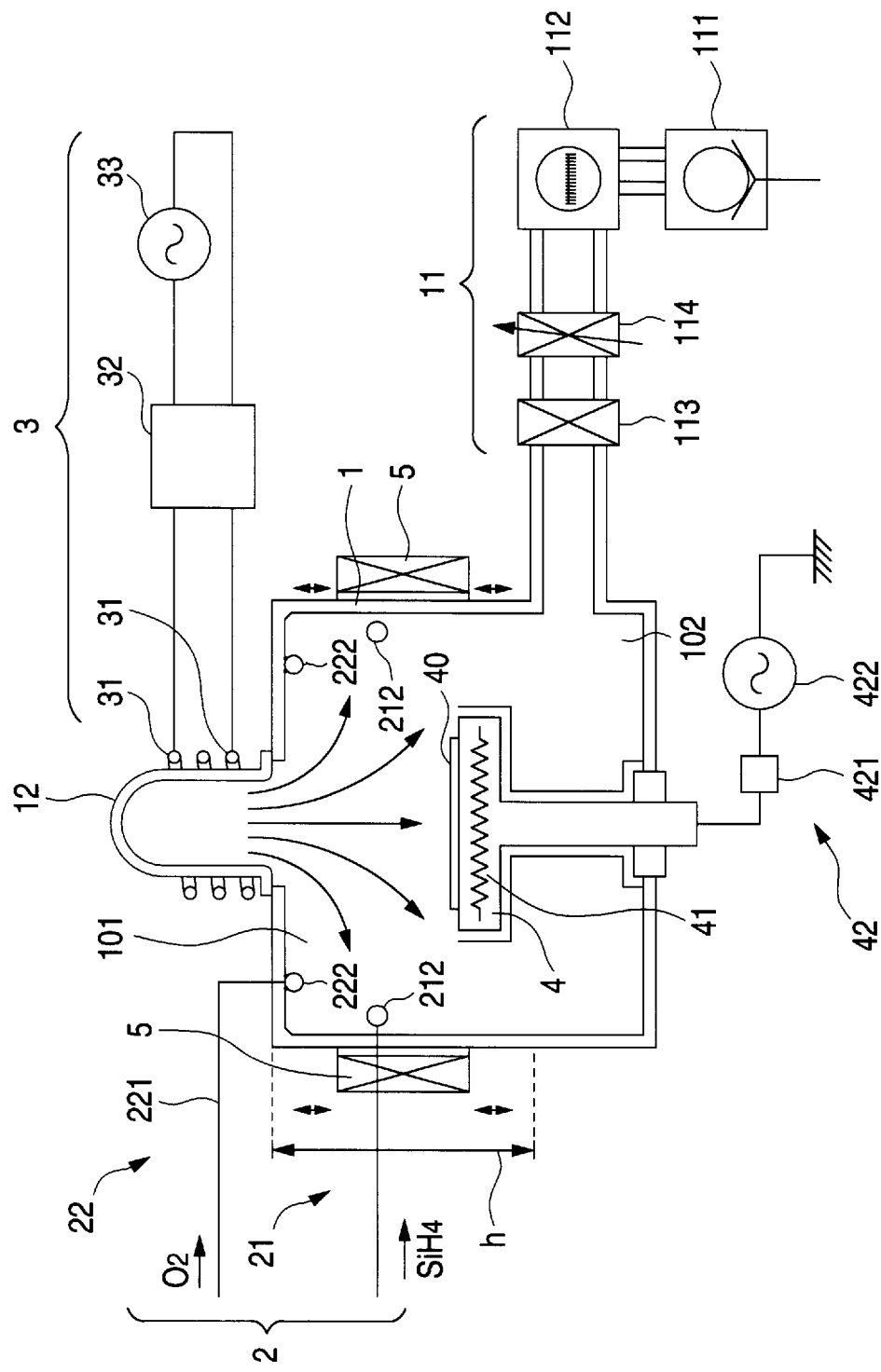
FIG. 4 is a schematic view showing a vacuum processing system according to a second embodiment of the invention.

A second embodiment of the vacuum processing system of the invention will be discussed. FIG. 4 is a schematic view showing the vacuum processing system according to the second embodiment of the invention. The vacuum processing system of the second embodiment is the same as that of the first embodiment shown in FIG. 1 except the configuration of plasma arrival prevention magnets 5 and move mechanism 6.

Plasma arrival prevention magnets 5 in the vacuum processing system shown in FIG. 4 are made of tubular electromagnets placed concentrically with a vacuum vessel 1 so as to surround the vacuum vessel 1. The electromagnets set magnetic lines of force extending axially (up and down) in the vacuum vessel 1. The magnetic lines of force cross perpendicularly to the plasma diffusion direction from the center to the peripheries and therefore have the effect of preventing plasma from arriving at the inner face of the vacuum vessel 1 as in the system shown in FIG. 1.

A move mechanism 6 in the embodiment shown in FIG. 4 is adapted to linearly move the plasma arrival prevention magnets 5 together in the axial direction.

As seen in FIG. 4, the plasma arrival prevention magnets 5 produce magnetic lines of force almost perpendicular to the plasma diffusion direction in the vicinity of the height of the center of the vacuum vessel 1, but the cross angle of the magnetic lines of force with the plasma diffusion direction lessens in the vicinities of the top and bottom ends of the vacuum vessel 1. That is, unevenness of the magnetic field vector exists. Thus, an uneven plasma density distribution as described above occurs and uneven thin film deposition on the inner face of the vacuum vessel 1 occurs.

Then, the move mechanism 6 moves the plasma arrival prevention magnets 5 axially for compensating the uneven magnetic field mentioned above.

Specifically, for example, the plasma arrival prevention magnets 5 are adapted to be able to move between predetermined lower and upper limit positions. To execute the first processing, the plasma arrival prevention magnets 5 are set to the center height. Then, they are moved downward by a predetermined distance $\Delta h$ before the second processing is started. When the move is repeated and the plasma arrival prevention magnets 5 reach the lower limit position, they are elevated by $\Delta h$, then the next vacuum processing is executed. While the plasma arrival prevention magnets 5 are elevated by $\Delta h$ during the processing interim, the processing is repeated. When the plasma arrival prevention magnets 5 reach the upper limit position, they are moved down. When a move is made after the allowable number of processing times mentioned above is reached, the plasma arrival prevention magnets 5 just reach the former center height position (one cycle of upward and downward movements). Therefore, $\Delta h$ is set from the height h of the portion to perform the plasma arrival prevention operation on the inner face of the vacuum vessel and the allowable number n of processing times; $\Delta h = 2h/n$.

A specific configuration example of the move mechanism 6 is as follows: The plasma arrival prevention magnets 5 made of electromagnets are held by a linear guide member (not shown) made of slide bearings or the like. A rotational motion of a motor is converted into a linear motion via a motion conversion mechanism such as a rack-and-pinion gear and the linear motion is transmitted to the plasma arrival prevention magnets 5, whereby the plasma arrival prevention magnets 5 can be linearly moved in the axial direction.

In the systems of the first and second embodiments, the move mechanism 6 may also be operated during the vacuum processing rather than during the vacuum processing interim. For example, the system of the first embodiment shown in FIG. 1 may be adapted to move the plasma arrival prevention magnets 5 by the above-mentioned move distance $\Delta d$ (=D/N) by the move mechanism 6 during one vacuum processing and not to move them during the processing interim. The system of the second embodiment shown in FIG. 4 may be adapted to move the plasma arrival prevention magnets 5 by $\Delta h$ (=2h/n) during the processing.

The total move distance to reaching the allowable number of processing times may also be lengthened. That is, for example, the system shown in FIG. 1 may be adapted to move the plasma arrival prevention magnets 5 at a distance twice, three times, . . . , or M times D (integer multiple of D) before the allowable number of processing times is reached. In the system shown in FIG. 4, additional one, two, . . . , or m cycles of upward and downward movements (integer multiple of 2h) may be increased for lengthening the total move distance. However, if the move distance is small, the move speed may be slow, so that the advantage of simplifying the configuration of the move mechanism 6 is provided.

Next, a modification will be discussed. In this modification, when a thin film deposited on the inner face of the vacuum vessel 1 is etched and removed, the move mechanism 6 relatively moves the plasma arrival prevention magnets 5 or the vacuum vessel 1.

As described above, in the vacuum processing systems of the first and second embodiments, a thin film is uniformly deposited on the inner face of the vacuum vessel 1, thus even if the conventional etching without moving the plasma arrival prevention magnets 5 is executed, a serious problem does not occur. However, if the plasma arrival prevention magnets 5 are also moved at the time of etching, compensation for an uneven plasma density distribution is provided and the supply amount of excited activated species to the inner face of the vessel is made uniform, so that uniform etching removal is executed.

To do this, during the etching removal, a move is made at the distance of D (=d1+d2) in the system shown in FIG. 1 or at the distance of 2h (one cycle of upward and downward movements) in the system shown in FIG. 4. Therefore, the move speed becomes higher than that in the above-mentioned embodiment. By making such a move, the etching uniformly proceeds and the conventional problems of the remaining thin film and prolonging the etching time can be solved.

In the description of the above-mentioned embodiments, the move mechanism 6 moves the plasma arrival prevention magnets 5, but it may move the vacuum vessel 1, namely, a relative move is required.

Although deposition of a silicon oxide thin film by plasma enhanced CVD has been discussed as an example of vacuum processing, the invention can also be applied to other vacuum processing systems of etching, sputtering and the like.

Further, a helicon wave excited plasma generating mechanism may also be adopted as the plasma generating mechanism. For the helicon wave excited plasma, the fact that when a strong magnetic field is applied, an electromagnetic wave having a lower frequency than the plasma vibration frequency propagates in plasma without attenuation is used; recently, attention has been given to the helicon wave excited plasma as a technique capable of producing high-density plasma at low pressure. When the electromagnetic wave propagation direction in the plasma is parallel with the magnetic field direction, the electromagnetic wave becomes circularly polarized light in one determined direction and proceeds helicoidally, based on which it is called helicon excited wave plasma.

To generate the helicon excited wave plasma, a loop-shaped antenna comprising one bar member bent to form an upper and lower 2-stage loop-like shape is disposed so as to surround the outside of the bell jar 12 in place of the high-frequency coil 31 shown in FIG. 1 or 4, and on the outside of the antenna, a DC electromagnet as helicon wave magnetic field setting means is placed concentrically with the bell jar 12. When high frequency power of 13.56 MHz is supplied from the high-frequency power supply 33 via the matching box 32 into the bell jar 12, the helicon wave excited plasma is generated by the action of a magnetic field.

As described above, according to the invention, since the thin film deposition on the inner face of the vacuum vessel becomes even, dust caused by the thin film which peels off is suppressed, and when the thin film is etched and removed, it is completely removed in a short time.

In addition, if the plasma arrival prevention magnets are moved during the etching removal of the thin film deposited on the inner face of the vacuum vessel, the plasma density distribution is made uniform and the etching uniformly proceeds. Thus, the problems of the remaining thin film on the inner face of the vessel and prolonging the etching time can be solved.

What is claimed is:

1. A vacuum processing system for generating plasma in a vacuum vessel and treating an object with the generated plasma, said vacuum processing system comprising:

plasma arrival prevention magnet means for forming a magnetic field along an inner face of the vacuum vessel to prevent the plasma from arriving at the inner face of the vacuum vessel; and move means for moving said plasma arrival prevention magnet means relatively to the vacuum vessel so as to compensate vector unevenness of said plasma arrival prevention magnet means in a direction of the inner face of the vacuum vessel for uniformly depositing a thin film on the inner face.

2. The vacuum processing system as claimed in claim 1, wherein said plasma arrival prevention magnet means includes a plurality of permanent magnets for forming alternately different magnetic poles on and along the inner face of the vacuum vessel.

3. The vacuum processing system as claimed in claim 2, wherein the permanent magnets are equally spaced from each other circumferentially along an outer face of the vacuum vessel.

4. The vacuum processing system as claimed in claim 3, wherein the permanent magnets are plate-shaped magnets placed so as to extend to top and bottom along the outer face of the vacuum vessel.

5. The vacuum processing system as claimed in claim 3, wherein the permanent magnets are held by a magnet holder containing partitions for partitioning inside thereof according to width and spacing of the magnets.

6. The vacuum processing system as claimed in claim 5, wherein said move means includes a crank coupled to the magnetic holder and a drive source for driving the crank to rotate the magnet holder at a predetermined angle.

7. The vacuum processing system as claimed in claim 1, wherein said move means moves said plasma arrival prevention magnet means during an interim of processing for the object.

8. The vacuum processing system as claimed in claim 1, further comprising a gas introduction mechanism for introducing gas for etching and removing the thin film deposited on the inner face of the vacuum vessel into the vacuum vessel, wherein when the thin film deposited on the inner face is etched and removed, said move means moves said plasma arrival prevention magnet means so as to compensate vector unevenness of said plasma arrival prevention magnet means in the inner face direction for uniform etching on the inner face.

9. A vacuum processing system for generating plasma in a vacuum vessel and treating an object with the generated plasma, said vacuum processing system comprising:

plasma arrival prevention magnet means for forming a magnetic field along an inner face of the vacuum vessel to prevent the plasma from arriving at the inner face of the vacuum vessel; and move means for moving the vacuum vessel relatively to said plasma arrival prevention magnet means so as to compensate vector unevenness of said plasma arrival prevention magnet means in a direction of the inner face of the vacuum vessel for uniformly depositing a thin film on the inner face.

10. The vacuum processing system as claimed in claim 9, wherein said plasma arrival prevention magnet means includes a plurality of permanent magnets for forming alternately different magnetic poles on and along the inner face of the vacuum vessel.

11. The vacuum processing system as claimed in claim 10, wherein the permanent magnets are equally spaced from each other circumferentially along an outer face of the vacuum vessel.

12. The vacuum processing system as claimed in claim 11, wherein the permanent magnets are plate-shaped magnets placed so as to extend to top and bottom along the outer face of the vacuum vessel.

13. The vacuum processing system as claimed in claim 11, wherein the permanent magnets are held by a magnet holder containing partitions for partitioning inside thereof according to width and spacing of the magnets.

14. The vacuum processing system as claimed in claim 9, wherein said move means moves the vacuum vessel during an interim of processing for the object.

15. The vacuum processing system as claimed in claim 9, further comprising a gas introduction mechanism for introducing gas for etching and removing the thin film deposited on the inner face of the vacuum vessel into the vacuum vessel, wherein when the thin film deposited on the inner face is etched and removed, said move means moves the vacuum vessel so as to compensate vector unevenness of said plasma arrival prevention magnet means in the inner face direction for uniform etching on the inner face.

16. The vacuum processing system as claimed in claim 1, wherein said plasma arrival prevention magnet means includes tubular electromagnets placed concentrically with the vacuum vessel so as to surround the vacuum vessel.

17. The vacuum processing system as claimed in claim 16, wherein the electromagnets set magnetic lines of force extending axially in the vacuum vessel.

18. The vacuum processing system as claimed in claim 17, wherein the electromagnets are linearly moved up and down.

19. The vacuum processing system as claimed in claim 9, wherein said plasma arrival prevention magnet means includes tubular electromagnets placed concentrically with the vacuum vessel so as to surround the vacuum vessel.

20. The vacuum processing system as claimed in claim 19, wherein the electromagnets set magnetic lines of force extending axially in the vacuum vessel.

21. The vacuum processing system as claimed in claim 20, wherein the vacuum vessel is linearly moved up and down.

* * * * *